United States Patent
Nagels et al.

(10) Patent No.: US 11,856,692 B2
(45) Date of Patent: Dec. 26, 2023

(54) INTERCONNECT, AN ELECTRONIC ASSEMBLY AND A METHOD FOR MANUFACTURING AN ELECTRONIC ASSEMBLY

(71) Applicants: IMEC VZW, Leuven (BE); UNIVERSITEIT HASSELT, Hasselt (BE)

(72) Inventors: Steven Nagels, Hasselt (BE); Thijs Vandenryt, Herk-de-Stad (BE); Wim Deferme, Hechtelt (BE)

(73) Assignees: IMEC VZW, Leuven (BE); UNIVERSITEIT HASSELT, Hasselt (BE)

( * ) Notice: Subject to any disclaimer, the term of this patent is extended or adjusted under 35 U.S.C. 154(b) by 22 days.

(21) Appl. No.: 17/864,707

(22) Filed: Jul. 14, 2022

(65) Prior Publication Data

US 2023/0012885 A1 Jan. 19, 2023

(30) Foreign Application Priority Data

Jul. 15, 2021 (EP) ..................... 21185696

(51) Int. Cl.
*H05K 1/18* (2006.01)
*H05K 1/02* (2006.01)
(Continued)

(52) U.S. Cl.
CPC ........... *H05K 1/0283* (2013.01); *H01R 12/79* (2013.01); *H05K 1/0393* (2013.01); *H05K 1/147* (2013.01);
(Continued)

(58) Field of Classification Search
CPC .... H05K 1/0283; H05K 1/0393; H05K 1/147; H05K 3/326; H05K 2201/0129; H01R 12/79
(Continued)

(56) References Cited

U.S. PATENT DOCUMENTS 9,247,648 B2 * 1/2016 Vanfleteren ............ H05K 1/186
11,088,063 B2 8/2021 Ronay et al.
(Continued)

FOREIGN PATENT DOCUMENTS

| WO | WO-2019022619 A1 | 1/2019 |
| WO | WO-2020041605 A1 | 2/2020 |
| WO | WO-2021073828 A1 | 4/2021 |

OTHER PUBLICATIONS

Kramer et al: "Soft Curvature Sensors for Joint Angle Proprioception", 2011 IEEE/RSJ International Conference on Intelligent Robots and Systems, 2011, pp. 1919-1926.
(Continued)

*Primary Examiner* — Binh B Tran
(74) *Attorney, Agent, or Firm* — MOSER TABOADA

(57) ABSTRACT

An interconnect for connecting a first electronic circuit to a second, external stretchable electronic circuit device comprises: conductive lines of the first electronic circuit arranged in a plane; connectors configured to define an overlap in the plane between each end of the conductive lines with a corresponding end of stretchable conductive lines providing an electrical connection between the conductive lines and the stretchable conductive lines over the entire overlap; and at least one anchoring structure for providing an anchoring of the first electronic circuit with the second, external stretchable electronic circuit device, wherein the at least one anchoring structure provides
(Continued)

anchoring transverse to the plane in anchoring positions on opposite sides of the overlap.

15 Claims, 4 Drawing Sheets

(51) Int. Cl.
    *H01R 12/79*     (2011.01)
    *H05K 1/03*     (2006.01)
    *H05K 1/14*     (2006.01)
    *H05K 3/32*     (2006.01)

(52) U.S. Cl.
    CPC ..... *H05K 3/326* (2013.01); *H05K 2201/0129* (2013.01)

(58) Field of Classification Search
    USPC .......................................................... 361/748
    See application file for complete search history.

(56) References Cited

U.S. PATENT DOCUMENTS

| | | |
|---|---|---|
| 2007/0194428 A1 | 8/2007 | Sato et al. |
| 2017/0086291 A1* | 3/2017 | Cotton .............. H01L 31/03926 |
| 2018/0024411 A1 | 1/2018 | Miyazaki et al. |
| 2019/0339141 A1 | 11/2019 | Gisby et al. |

OTHER PUBLICATIONS

Extended European Search Report in European Patent Application No. 21185696.8 dated Jan. 10, 2022.

* cited by examiner

INTERCONNECT, AN ELECTRONIC ASSEMBLY AND A METHOD FOR MANUFACTURING AN ELECTRONIC ASSEMBLY

CROSS REFERENCE TO RELATED APPLICATION

This application claims priority to European Patent Application No. 21185696.8, filed on Jul. 15, 2021, incorporated herein by reference in its entirety.

TECHNICAL FIELD

The present inventive concept relates to an interconnect for connecting a first electronic circuit to a second electronic circuit device, wherein the second electronic circuit device is based on stretchable electronics. The present inventive concept further relates to an assembly including the stretchable electronic circuit device and the interconnect, and a method for manufacturing the assembly.

BACKGROUND

In recent years, stretchable electronics have been developed. Stretchable electronics allows forming electronic circuit devices that can be deformed, such as being stretched, and can re-assume an original shape after deformation.

Flexible electronics, wherein an electronic circuit device may be bent (flexed), but the electronic circuit device cannot be stretched, have been known for a long time. However, a stretchable electronic circuit device may be viewed as being elastic, which implies that the electronic circuit device can be bent, but it can also be stretched or otherwise deformed.

Stretchable electronic circuit devices may use stretchable conductive lines, based e.g. on liquid metal, which allows the conductive lines to maintain an electrical connection between components of the stretchable electronic circuit device even though the conductive lines are stretched or otherwise deformed.

Stretchable electronic circuit devices are of particular interest for use in wearable applications such that sensor(s) may be worn by a person, e.g. in a medical application. By using stretchable electronic circuit devices, the device may be adapted to a shape of the person and may be comfortably worn during use.

Although processing of signals may be performed within the stretchable electronic circuit device, the stretchable electronic circuit device would advantageously be connected to conventional, non-stretchable electronic circuits, which may provide more advanced processing of signals or otherwise provide further functionality to the stretchable electronic circuit device. However, when connecting the stretchable electronic circuit device to another electronic circuit, which is non-stretchable, an interconnect to the stretchable electronic circuit device risks breaking or losing an electrical connection to the stretchable electronic circuit device, when the stretchable electronic circuit device is deformed.

Thus, there is a need to design a suitable interconnect for connecting an electronic circuit to a stretchable electronic circuit device such that electrical connection may be firmly maintained when the stretchable electronic circuit device is deformed.

SUMMARY

An objective of the present inventive concept is to provide a firm electrical connection between a first electronic circuit and a second stretchable electronic circuit device.

This and other objectives are at least partly met by the invention as defined in the independent claims. Preferred embodiments are set out in the dependent claims.

According to a first aspect, there is provided an interconnect for connecting a first electronic circuit to a second, external stretchable electronic circuit device, the interconnect comprising: conductive lines of the first electronic circuit, wherein the conductive lines are arranged in a plane; connectors configured to define a path of ends of the conductive lines in the plane and configured to receive ends of stretchable conductive lines of the second, external stretchable electronic circuit device, wherein the connectors are configured to define an overlap in the plane between each end of the conductive lines with a corresponding end of the stretchable conductive lines, wherein the overlap extends from the end of the stretchable conductive line along the stretchable conductive line and provides an electrical connection between the conductive lines and the stretchable conductive lines over the entire overlap; and at least one anchoring structure for providing an anchoring of the first electronic circuit with the second, external stretchable electronic circuit device, wherein the at least one anchoring structure provides anchoring transverse to the plane in anchoring positions on opposite sides of the overlap.

Thanks to the interconnect, there is defined an overlap between ends of the conductive lines of the first electronic circuit and ends of the stretchable conductive lines of the second stretchable electronic circuit device. Using an overlap ensures that there will be contact between the conductive lines of the first electronic circuit and the second electronic circuit device over a distance along the conductive lines. Electrical connection will thus be provided along the distance to provide a reliable connection, which is much more reliable compared to if the ends of the conductive lines would be merely touching at an interface.

Further, the interconnect provides anchoring transverse to the plane in which the overlap is defined. This implies that the anchoring structure enables the stretchable electronic circuit device to be fixed in relation to the plane. Thus, the anchoring structure enables defining a plurality of fixed positions of the stretchable electronic circuit device on opposite sides of the overlap, wherein the fixed positions have a fixed interrelationship. Hence, the fixed positions will prevent the stretchable electronic circuit device from being pulled away from the overlap, such that a firm and reliable connection between the first electronic circuit and the second stretchable electronic circuit device is defined by the interconnect.

Thanks to the interconnect, a firm and reliable connection may be provided between the first electronic circuit and the second stretchable electronic circuit device. This implies that the first electronic circuit may expand functionalities of the second stretchable electronic circuit device. By having a reliable connection to the second stretchable electronic circuit device, all functionality need not be integrated within the second stretchable electronic circuit device. This greatly increases versatility of the stretchable electronic circuit device as the functionality may be added when needed, because further components may be connected to the first electronic circuit when desired. Thus, functionality is not fixed during manufacturing of the second stretchable electronic circuit device.

The interconnect may define a first direction, which extends parallel to a path in which at least one stretchable conductive line is received by the interconnect. The overlap has a first side and a second side in relation to the first direction, such that the first direction crosses the overlap between the first side and the second side. The anchoring positions being provided on opposite sides of the overlap implies that anchoring positions are provided outside the overlap at the first side and the second side of the overlap.

As used herein, "stretchable electronic circuit device" should be construed as an electronic circuit device which is arranged within a stretchable material. The device as a whole, including an electronic circuit, is stretchable so that outer or inner shapes of the device may be deformed. The electronic circuit device may comprise electrical components which are not stretchable, but which may be moved when the device as a whole is stretched or deformed. The electronic circuit device further comprises stretchable conductive lines extending between electrical components or providing a connection to at least one electrical component. At least the stretchable conductive lines are stretchable such that functionality of the electronic circuit is maintained as the device is stretched or deformed. Thus, the second electronic circuit device may for instance embed a processing unit and sensors, which are not stretchable, but a relation between the processing units and the sensors may be varied thanks to the components being embedded in a stretchable device, while stretchable conductive lines ensure that the functionality of the electronic circuit is maintained.

The second electronic circuit device being stretchable implies that the second electronic circuit device is elastic so as to be able to deform by being stretched or expanded when a force is applied and to return to an original size and shape when the force is removed. The electronic circuit device is therefore not only flexible allowing the electronic circuit device to be bent, but is also stretchable.

According to an embodiment, the second electronic circuit device may exhibit at least 3% strain for more than one cycle of deformation. According to an embodiment, the second electronic circuit device may exhibit at least 5%, such as at least 10% strain for more than one cycle of deformation. The second electronic circuit device is able to return to original size and shape between the cycles of deformation.

The first electronic circuit may be non-stretchable in that the first electronic circuit is at least less stretchable than the second stretchable electronic circuit device. The first electronic circuit may however be flexible to allow the first electronic circuit to be bent or flexed.

The connectors may be structurally formed to define locations in which stretchable conductive lines will be received. The connectors may thus define an area of the overlap. The connectors may be arranged close to each other for receiving a plurality of stretchable conductive lines in close relation to each other, such that an overall area of the overlap may be small.

According to an embodiment, the at least one anchoring structure is integral with the connectors. This implies that the anchoring structure fixes the first electronic circuit to the second, external stretchable electronic circuit device by fixing the second, external stretchable electronic circuit device in relation to connector being integral with the anchoring structure.

According to another embodiment, the anchoring structure poses as a separate component that provides both anchoring of the second stretchable electronic circuit device to the anchoring structure as well as anchoring to the first electronic circuit in anchoring positions on opposite sides of the overlap.

The second stretchable electronic circuit device could comprise an outer material, which is stretchable and in which the electronic circuit including the stretchable conductive lines are arranged. The anchoring structure may be configured to be fixedly connected to the outer material of the second stretchable electronic circuit device in the anchoring positions for anchoring of the first electronic circuit with the second stretchable electronic circuit device.

However, according to an alternative, the second stretchable electronic circuit device could comprise a material layer or structure, which is dedicated to providing anchoring of the second stretchable electronic circuit device. Thus, the material layer or structure may be provided in a portion of the stretchable electronic circuit device which is to be connected to the anchoring structure. The material layer or structure may comprise a pre-coating material or a primer material, which may be provided at least in a dedicated portion of the second stretchable electronic circuit device before an outer encapsulating layer is provided. The material layer or structure may be provided at least in a dedicated portion of the second stretchable electronic circuit device even before the stretchable conductive lines are provided, such as the material layer or structure being a corrosion barrier. The material layer or structure may alternatively comprise an adhesive, which may be provided on an external surface of the stretchable electronic circuit device. The material layer or structure may yet alternatively comprise an outer encapsulating layer with a lower elasticity (higher Young's modulus) than an inner encapsulating layer of the second stretchable electronic circuit device.

The second stretchable electronic circuit device is external to the interconnect in that the interconnect structurally defines how the second stretchable electronic circuit device will be received by the interconnect. The interconnect defines relations between the anchoring structure and the connectors such that anchoring positions to which the second stretchable electronic circuit device will be connected are defined even before the second stretchable electronic circuit device is actually connected to the interconnect. Hence, the interconnect may be separately manufactured. The interconnect may be connected to the second stretchable electronic circuit device e.g. during manufacturing of the stretchable electronic circuit device such that a connection is generated to be integrated with the second electronic circuit device when it is manufactured.

According to an embodiment, the connectors comprise a plurality of fingers spaced apart such that the end of one stretchable conductive line of the stretchable conductive lines is configured to be received between two adjacent fingers.

The fingers may thus provide a well-defined structure for receiving the stretchable conductive lines, defining a position of the received stretchable conductive lines. The ends of the stretchable conductive lines may be received between adjacent fingers such that the stretchable conductive lines extend in parallel with the fingers. The overlap may be defined between the adjacent fingers along a portion of the extension of the fingers, such that a position of the stretchable conductive lines may be defined between the fingers in an overlap region and further in a region extending away from the overlap region.

The fingers provide a well-defined positioning of the stretchable conductive lines of the second stretchable electronic circuit device. This ensures that a firm connection between the conductive lines and the stretchable conductive lines can be provided by the interconnect.

According to an embodiment, the connectors define a path of the conductive lines of the first electronic circuit between the fingers extending along a part of the fingers.

Thus, the fingers also provide a well-defined positioning of the conductive lines of the first electronic circuit. This further ensures that a firm connection between the conductive lines and the stretchable conductive lines can be provided by the interconnect.

According to an embodiment, the fingers extend in parallel.

This may enable an overlap region to be defined for connecting a plurality of conductive lines of the first electronic circuit with a plurality of stretchable conductive lines of the second stretchable electronic circuit device in a small area.

According to another embodiment, the fingers are branched in different directions from a common carrier for carrying the conductive lines.

This implies that the overlap region may be expanded from the common carrier, such that well-defined relations between the conductive lines of the first electronic circuit and the stretchable conductive lines of the second stretchable electronic circuit device may be defined in the overlap region while allowing the conductive lines of the first electronic circuit to extend away from the interface within a small common carrier.

According to an embodiment, the anchoring structures comprise throughgoing holes in the connectors.

This provides a simple manner of connecting the first electronic circuit to the second stretchable electronic circuit device. The throughgoing holes allow an encapsulating layer of the stretchable electronic circuit device to be cast through the holes such that an encapsulating layer intertwined with the interconnect may be formed. This ensures a firm anchoring of the second stretchable electronic circuit device to the interconnect in a simple manner.

According to an embodiment, the anchoring structures comprise one or more of: hooks, barbs, fibrous network, a surface exposed to surface activating treatment or a chemically treated surface.

These alternatives are also able to provide firm anchoring of the second stretchable electronic circuit device to the interconnect. The anchoring structures provide an expansion of a surface to provide structures allowing anchoring of the second stretchable electronic circuit device to the interconnect.

A surface activating treatment should be construed as a surface being exposed to a treatment for physically changing the surface enabling anchoring structures to be formed. For instance, the surface activating treatment may involve exposing the surface to a corona treatment, an ultraviolet/ozone treatment, or a plasma treatment.

A chemically treated surface should be construed as a surface being exposed to a chemical group or charges for altering a chemistry of the surface or for providing a surface layer with an altered chemistry. For instance, a chemically treated surface may be provided using silane and siloxane primers.

According to an embodiment, the interconnect further comprises a lateral anchor extending laterally from the overlap and including at least one anchoring structure providing anchoring transverse to the plane in anchoring positions at a lateral side of the overlap.

The overlap may define an overlap region that has a substantially rectangular shape. As described above, anchoring positions are provided on opposite sides of the overlap region, wherein a first direction, which extends parallel to a path in which at least one stretchable conductive line is received by the interconnect, crosses the overlap region between the opposite sides. The lateral anchor may be arranged at a lateral side, i.e. at a side which extends substantially in parallel with the first direction, between the opposite first and second sides. Lateral anchoring positions are thus provided outside the overlap at the lateral side.

This implies that anchoring may be provided at least on three sides, or preferably on four sides, around the overlap region such that anchoring positions are arranged surrounding the overlap region. This further ensures a firm anchoring of the second stretchable electronic circuit device to the interconnect.

It should further be realized that the anchoring structures may further be provided within an overlap region, providing anchoring transverse to the plane in anchoring positions within the overlap region. This may further ensure a firm anchoring of the second stretchable electronic circuit device to the interconnect. Anchoring positions within the overlap region may or may not be combined with anchoring positions at a lateral side of the overlap.

According to an embodiment, the conductive lines are arranged at a flexible printed circuit board.

The flexible printed circuit board provides a flexible connection to the stretchable electronic circuit device. The flexible printed circuit board may be used in itself to provide increased functionality to the stretchable electronic circuit device.

The connection between the first electronic circuit and the stretchable electronic circuit device may be fixed and irreversible once the connection has been formed. Thus, by connecting the stretchable electronic circuit device to a flexible printed circuit board, outer dimensions, shape and size of a combination of the first electronic circuit and the second stretchable electronic circuit device are still allowed to be varied to a great extent after the connection has been formed.

Further, the flexible printed circuit board also provides a simple interface for further connection to other circuitry, such as a rigid printed circuit board.

According to an embodiment, the flexible printed circuit board comprises a connector for connecting the flexible printed circuit board to a rigid printed circuit board such that the interconnect is configured to form an intermediate connector between the second, external stretchable electronic circuit device and the rigid printed circuit board.

Thus, the flexible printed circuit board may be fixedly connected to the stretchable electronic circuit device. The flexible printed circuit board also provides a possibility to connect and disconnect a rigid printed circuit board. This provides versatility in providing additional functionalities to the stretchable electronic circuit device.

However, it should be realized that, in other embodiments, the conductive lines of the first electronic circuit are arranged at a rigid printed circuit board, and the rigid printed circuit board is directly connected to the stretchable electronic circuit device.

According to a second aspect, there is provided an electronic assembly, comprising: a stretchable electronic circuit device comprising stretchable conductive lines; and an interconnect according to the first aspect connected to the stretchable electronic circuit device.

In other words, according to the second aspect, there is provided an electronic assembly comprising a first electronic circuit comprising conductive lines, a second stretchable electronic circuit device comprising stretchable conductive lines, and an interconnect, wherein the interconnect carries conductive lines of the first electronic circuit, wherein the conductive lines are arranged in a plane; wherein the interconnect further comprises connectors configured to define a path of ends of the conductive lines in the plane and configured to receive ends of the stretchable conductive lines of the second stretchable electronic circuit device, wherein the connectors are configured to define an overlap in the plane between each end of the conductive lines with a corresponding end of the stretchable conductive lines, wherein the overlap extends from the end of the stretchable conductive line along the stretchable conductive line and provides an electrical connection between the conductive lines and the stretchable conductive lines over the entire overlap; and at least one anchoring structure for providing an anchoring of the first electronic circuit with the second stretchable electronic circuit device, wherein the at least one anchoring structure provides anchoring transverse to the plane in anchoring positions on opposite sides of the overlap.

Effects and features of the second aspect are largely analogous to those described above in connection with the first aspect. Embodiments mentioned in relation to the first aspect are largely compatible with the second aspect.

The electronic assembly provides the first electronic circuit that expands functionalities of the second stretchable electronic circuit device, such that advantages of having a stretchable electronic circuit device is provided while enabling functionality to be connected/disconnected whenever a need arises by connecting to the first electronic circuit.

According to an embodiment, the electronic assembly further comprises an outer encapsulating layer surrounding the stretchable electronic circuit device, wherein the encapsulating layer is configured to surround the connectors and engage with the at least one anchoring structure of the interconnect forming a connection between the anchoring structure and the stretchable electronic circuit device.

Thus, the outer encapsulating layer may encapsulate the electronic circuit of the stretchable electronic circuit device and may further encapsulate the overlap between the ends of the conductive lines of the first electronic circuit and the ends of the stretchable conductive lines of the second electronic circuit device. The outer encapsulating layer may further encapsulate at least a part of the connectors defining the overlap.

This provides a firm connection in the assembly between the first electronic circuit and the second electronic circuit device. The outer encapsulating layer may thus be used for forming the firm connection while also forming the outer layer of the second stretchable electronic circuit device.

According to an embodiment, the encapsulating layer is configured to embed the anchoring structures in the encapsulating layer such that the anchoring positions define locations in the stretchable electronic circuit device being immobilized in relation to each other.

Thus, the stretchable electronic circuit device is locally, between the anchoring positions, immobilized such that the stretchable electronic circuit device is not deformable, or is only deformable to a very small degree, between the anchoring positions. This implies that the electrical connection between the first electronic circuit and the second stretchable electronic circuit device may be firmly maintained.

According to an embodiment, the stretchable conductive lines are formed by a conductive material that is in a liquid state in an operating temperature range.

This is a suitable manner of providing a line which is stretchable and which maintains conductivity of the line when the line is stretched.

According to an embodiment, the conductive material is a liquid metal, such as a eutectic alloy of gallium-indium, gallium-indium-tin, gallium-tin-zinc, gallium-indium-tin-zinc, gallium-indium-zinc, or gallium-tin. However, it should be realized that the conductive material may alternatively be formed by a conductive ink, stretchable conductive composite or any other conductive liquid.

According to a third aspect, there is provided a method for manufacturing an electronic assembly, said method comprising: forming stretchable conductive lines; forming an interconnect comprising: conductive lines of a first electronic circuit, wherein the conductive lines are arranged in a plane; connectors configured to define a path of ends of the conductive lines in the plane; and at least one anchoring structure for providing an anchoring of the first electronic circuit with the stretchable conductive lines, wherein the at least one anchoring structure provides anchoring transverse to the plane; arranging the stretchable conductive lines such that ends of the stretchable conductive lines are received by the connectors of the interconnect, wherein the connectors define an overlap in the plane between each end of the conductive lines with a corresponding end of the stretchable conductive lines, wherein the overlap extends from the end of the stretchable conductive line along the stretchable conductive line and provides an electrical connection between the conductive lines and the stretchable conductive lines over the entire overlap, wherein the stretchable conductive lines are further arranged such that the at least one anchoring structure provides anchoring positions on opposite sides of the overlap; casting an outer encapsulating material to form an encapsulation around the stretchable conductive lines and to engage with the at least one anchoring structure for anchoring the interconnect to the stretchable conductive lines.

Effects and features of the second aspect are largely analogous to those described above in connection with the first aspect. Embodiments mentioned in relation to the first aspect are largely compatible with the second aspect.

Thanks to the encapsulating material being cast to engage with the at least one anchoring structure, the stretchable conductive lines may be firmly connected to the conductive lines of the first electronic circuit at the same time as an outer layer of the stretchable electronic circuit device is formed. Hence, the firm connection may be established when the stretchable electronic circuit device is manufactured.

This ensures that the stretchable electronic circuit device is provided with further functionality of the first electronic circuit at manufacturing. The first electronic circuit also allows an interface for simple connection of further electronic components to the stretchable electronic circuit device after manufacturing of the stretchable electronic circuit device.

The outer encapsulating material may be formed by an elastomer or thermoplastic material. For instance, silicone rubbers, polyurethanes, or natural rubbers may be used. However, as understood by the person skilled in the art, other alternatives are also possible.

BRIEF DESCRIPTION OF THE DRAWINGS

The above, as well as additional objects, features, and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
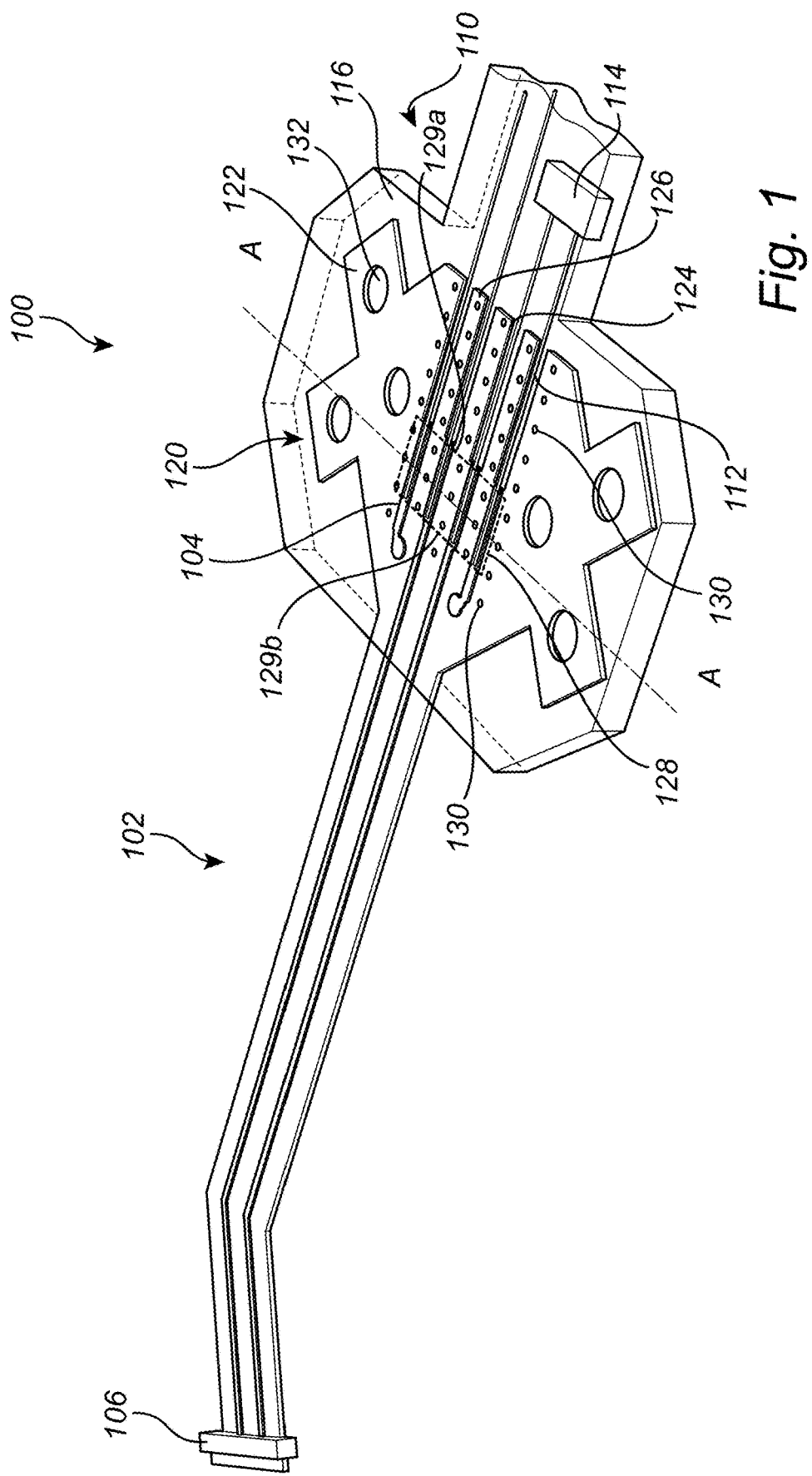
FIG. 1 is a schematic view of an electronic assembly according to an embodiment.

Referring now to FIG. 1, an electronic assembly 100 connecting a first electronic circuit 102 with a second stretchable electronic circuit device 110 will be described. The electronic assembly 100 comprises an interconnect 120 which provides a physical interface for connecting the first electronic circuit 102 with a stretchable electronic circuit device 110.

As shown in FIG. 1, the interconnect 120 may be integral with a structure carrying the first electronic circuit 102. However, it should be realized that the interconnect 120 may alternatively be separate from such structure and a connection between the first electronic circuit 102 and the interconnect 120 may be formed while the interconnect 120 also connects the first electronic circuit 102 to the second stretchable electronic circuit device 110.

The first electronic circuit 102 is illustrated in FIG. 1 as being a flexible printed circuit board, wherein conductive lines 104 are arranged in one or more conductive layers of the printed circuit board. The conductive layer(s) may be covered by protective layers. The flexible printed circuit board may or may not further comprise electronic components interconnected by the conductive lines 104.

The interconnect 120 comprises conductive lines 104 of the first electronic circuit 102, wherein the conductive lines 104 are exposed at the interconnect 120 to allow the conductive lines 104 to be connected to stretchable conductive lines 112 of the second stretchable electronic circuit device 110.

The interconnect 120 may comprise an expansion end 122 forming an expansion of the first electronic circuit 102 with an increased lateral dimension at an end to be connected to the second stretchable electronic circuit device 110. The expansion end 122 may be integral with the flexible printed circuit board. The expansion end 122 may be formed as an extension of layers of the flexible printed circuit board or may be formed in other material(s) being integrated with the flexible printed circuit board.

The interconnect 120 comprises connectors 124, which may be formed in the expansion end 122. The connectors 124 are configured to define arrangement of, and thereby an interrelationship between, the exposed conductive lines 104 and stretchable conductive lines 122.

The connectors 124 may be provided in form of fingers 126, which are arranged to be spaced apart for defining a space between adjacent fingers 126 in which a stretchable conductive line 112 is received such that a path of an end of the stretchable conductive line 112 is defined. Further, a path of an exposed end of the conductive lines 104 of the first electronic circuit 102 is also defined between the fingers 126.

Figure 2:
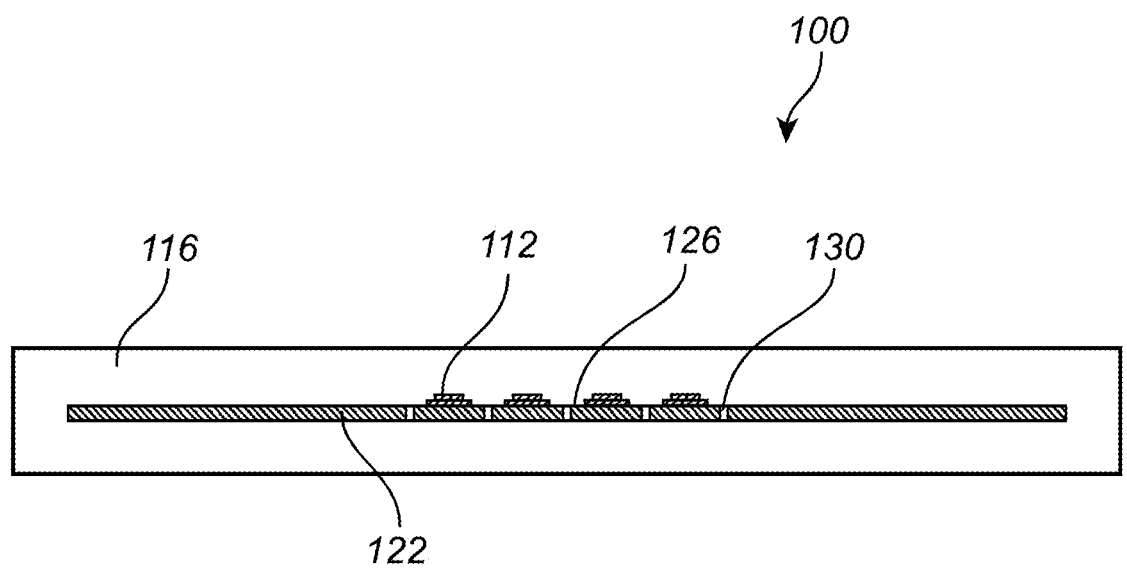
FIG. 2 is a cross-section of the electronic assembly along the line A-A in FIG. 1.

The connectors 124 define an overlap between the conductive lines 104 and the stretchable conductive lines 112 in a plane in which the conductive lines 104 extend. The overlap is defined in an overlap region 128. The overlap is further illustrated in FIG. 2, showing a cross-section through the interconnect 120 at line A-A in FIG. 1.

The overlap is defined such that ends of the conductive lines 104 and corresponding ends of the stretchable conductive lines 112 overlap along an extension of the paths of the conductive lines 104 and the paths of the stretchable conductive lines 112, respectively. Thus, an electrical connection is formed between the conductive lines 104 and the corresponding stretchable conductive lines 112 along the entire overlap.

Ends of the conductive lines 104 in the flexible printed circuit board may be provided by castellated holes, which may be formed by punching through the flexible printed circuit board and plating an end of the flexible printed circuit board, similar as to forming of plated through holes in the flexible printed circuit board when access to a conductive line 104 is desired. Conductive lines may be formed on opposite sides of the flexible printed circuit board. The conductive lines may be connected via the plated end. This may further facilitate forming a strong electrical connection to the stretchable conductive lines 104 as the connection may be formed both at the plated end of the flexible printed circuit board and on both sides of the plated flexible printed circuit board between the fingers 126.

The interconnect 120 further comprises at least one anchoring structure 130. As shown in FIG. 1, the interconnect 120 may comprise a plurality of anchoring structures 130. The anchoring structures 130 may be provided on all sides in relation to the overlap region 128 to provide anchoring positions surrounding the overlap region 128. The interconnect 120 at least provides anchoring positions on opposite sides 129a, 129b of the overlap region 128 in relation to a direction of the overlap between the conductive lines 104 and the stretchable conductive lines 112 such that the overlap along the direction crosses the overlap region 128 between the opposite sides 129a, 129b.

The anchoring structures 130 may be provided as throughgoing holes in the expansion end 122 of the interconnect 120. Thus, the anchoring structures 130 may comprise walls extending through the expansion end 122 and defining the throughgoing holes. The throughgoing holes may be provided in one or more portions of the expansion end 122 of the interconnect 120. For instance, the throughgoing holes may be provided in the connectors 124 forming anchoring structures 130 in the connectors 124. Also, the expansion end 122 may comprise a lateral expansion extending in a direction transverse to the direction of the overlap between the conductive lines 104 and the stretchable conductive lines 112. The anchoring structures 130 may further comprise lateral anchors 132 arranged in the lateral expansion of the expansion end 122 to further strengthen a connection between the first electronic circuit 102 and the second stretchable electronic circuit device 110. These lateral anchors 132 may define larger throughgoing holes than the throughgoing holes of the anchoring structures 130 on the opposite sides 129a, 129b. Thus, a stronger connection may be provided by each of the lateral anchors 132, while fewer lateral anchors 132 are provided compared to the anchoring structures 130.

Also, anchoring structures 130 may be provided within the overlap region 128. Such anchoring structures 130 may be formed in the fingers 126 defining throughgoing holes therethrough within the overlap region 128.

The anchoring structures 130 and lateral anchors 132 may be configured to establish a fixed connection to a portion of the stretchable electronic circuit device 110. For instance, the anchoring structures 130 may engage with different parts of the stretchable electronic circuit device 110 to define a fixed interrelationship with the different parts of the stretchable electronic circuit device 110.

When the anchoring structures 130 and lateral anchors 132 define throughgoing holes, a stretchable material of the stretchable electronic circuit device 110 may extend through the throughgoing holes and between the throughgoing holes on opposite sides of the expansion end 122. In this manner, a fixed relation between the throughgoing holes is defined such that the anchoring positions define locations in the stretchable electronic circuit device 110 being immobilized in relation to each other.

The anchoring structures 130 and lateral anchors 132 provide anchoring transverse to the plane in which the conductive lines 104 extend.

Thanks to the interconnect 120 providing anchoring structures 130 on opposite sides 129a, 129b of the overlap region 128 and the anchoring structures 130 defining locations immobilized in relation to each other, the interconnect 120 provides a firm electrical connection between ends of the conductive lines 104 of the first electronic circuit 102 and ends of the stretchable conductive lines 112 of the second electronic circuit device 110 that will not break when the stretchable electronic circuit device 110 is stretched and deformed.

It should be realized that the anchoring structures 130 may be provided in alternative manners, allowing the interconnect 120 to engage with the second stretchable electronic circuit device 110 in another manner. It should also be realized that combinations of different types of anchoring structures 130 may be used.

For instance, the anchoring structures may comprise one or more of: hooks, barbs, fibrous network, a surface exposed to surface activating treatment or a chemically treated surface.

The stretchable electronic circuit device 110 is stretchable so that the stretchable electronic circuit device 110 may be deformed. The stretchable electronic circuit device 110 may comprise one or more elastic materials allowing to be stretched when subject to a force. The stretchable electronic circuit device 110 may further comprise one or more electronic components 114 embedded in the elastic material(s) such that interrelationships between electronic components may be altered when the elastic material(s) are stretched.

The stretchable electronic circuit device 110 further comprises stretchable conductive lines 112, which may provide connections to the electronic components 114. Thus, the electronic circuit within the stretchable electronic circuit device 110 may maintain its functionality even though the electronic components 114 are moved in relation to each other.

The stretchable electronic circuit device 110 may for instance incorporate sensors and the stretchable electronic circuit device 110 may be configured to be worn by a person. Having a stretchable electronic circuit device 110 allows the electronic circuit device 110 to be adapted to a shape of a body part of the person without causing discomfort to the person. The stretchable electronic circuit device 110 may thus be worn directly by the person or may be incorporated in a garment worn by the person.

According to an embodiment, the second electronic circuit device 110 may exhibit at least 3% strain for more than one cycle of deformation. According to an embodiment, the second electronic circuit device 110 may exhibit at least 5%, such as at least 10% strain for more than one cycle of deformation. The second electronic circuit device 110 is able to return to original size and shape between the cycles of deformation.

The stretchable electronic circuit device 110 may comprise an encapsulating layer 116 forming one of the one or more elastic materials of the stretchable electronic circuit device 110.

The material of the encapsulating layer 116 may be cast through the throughgoing holes of the interconnect 120 so as to form a fixed relation between the stretchable electronic circuit device 110 and the interconnect 120 when the encapsulating layer 116 of the stretchable electronic circuit device 110 is formed.

The material of the encapsulating layer 116 may be formed by an elastomer or thermoplastic material. For instance, silicone rubbers, polyurethanes, or natural rubbers may be used. However, as understood by the person skilled in the art, other alternatives are also possible.

The stretchable conductive lines 112 may be formed by a conductive material that is in a liquid state in an operating temperature range. For instance, the conductive material is a liquid metal, such as a eutectic alloy of gallium-indium, which is liquid at room temperature.

The first electronic circuit 102 may extend functionality of the second stretchable electronic circuit device 110. For instance, bulky electronic components may be provided in the first electronic circuit 102 so as not to affect degrees of freedom in deforming the stretchable electronic circuit device 110 by embedding bulky components therein.

The first electronic circuit 102 may be a flexible printed circuit board, as illustrated in FIG. 1. However, it should be realized that the first electronic circuit 102 may be implemented in various manners and need not necessarily be provided in the form of a flexible printed circuit board. For instance, the first electronic circuit may be provided in the form of a rigid printed circuit board.

When the first electronic circuit 102 is provided as a flexible printed circuit board, the first electronic circuit 102 may further comprise a connector 106 for connecting the flexible printed circuit board to a rigid printed circuit board. Thus, the fixed connection to the stretchable electronic circuit device 110 provided by the interconnect 120 may provide an intermediate connector, which may further be selectively connected to a rigid printed circuit board using a connection which may be easily attached and detached.

Figure 3:
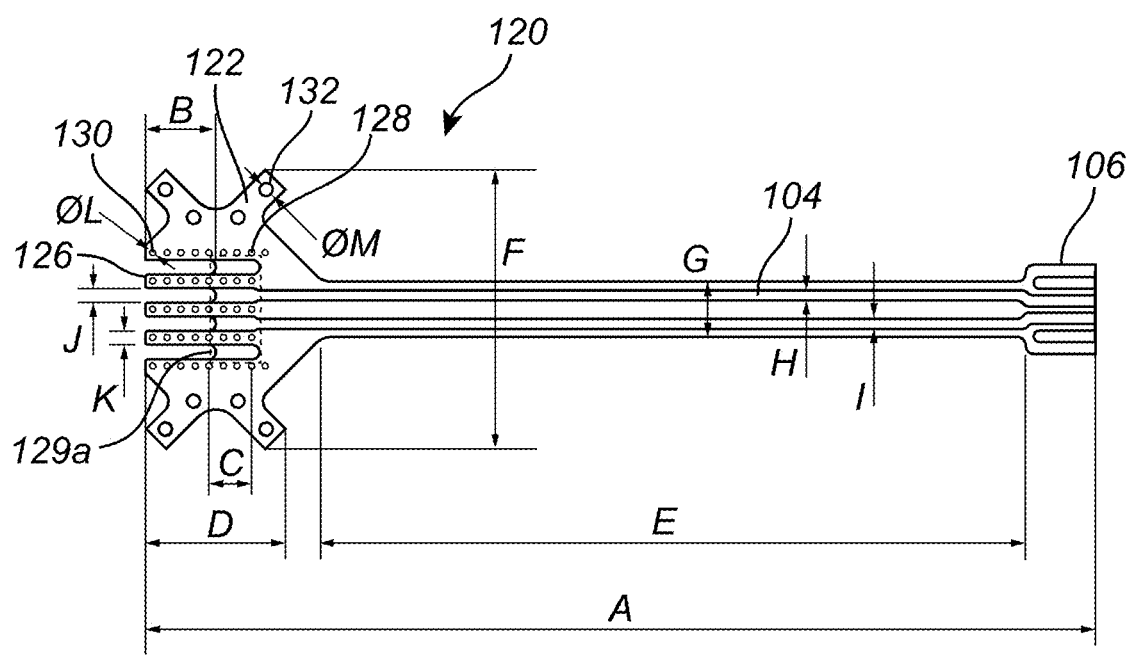
FIG. 3 is a schematic view of an interconnect according to an embodiment.

Referring now to FIG. 3, dimensions of the interconnect 120 according to an embodiment will be discussed.

Dimensions are indicated as letters A-G in FIG. 3, wherein:

A denotes a total length of the flexible printed circuit board from the expansion end 122 to the connector 106;

B denotes a distance in which immobilization of the second stretchable circuit device 110 is provided at a first side 129a outside the overlap region 126;

C denotes a distance in which immobilization of the second stretchable circuit device 110 is provided within the overlap region 128;

D denotes a width of the interconnect 120 which will be encapsulated into the encapsulating layer 116 of the second stretchable circuit device 110;

E denotes a connecting length between the connector 106 and the expansion end 122;

F denotes a height of the interconnect 120 which will be encapsulated into the encapsulating layer 116 of the second stretchable circuit device 110;

G denotes a width of the flexible printed circuit board along the connecting length E;

H, I denote a width of conductive lines 104;

J denotes a width of a spacing between adjacent fingers 126;

K denotes a width of the finger 126;

L denotes a diameter of a throughgoing hole of the anchoring structure 130; and

M denotes a diameter of a throughgoing hole of the lateral anchor 132.

According to the embodiment, the widths H, I may be in a range of 0.01 mm to 10 mm, such as in a range of 0.3 mm to 1 mm.

Dimensions of other features may be related to the widths H, I of the conductive lines 104.

The distance B of immobilization at the first side 129a may be in a range of 0.1 to 50 times the widths H, I, such as in a range of 4 to 8 times the widths H, I.

The distance C of immobilization within the overlap region 128 may be in a range of 0.1 to 50 times the widths H, I, such as in a range of 2 to 6 times the widths H, I.

The width D of the interconnect 120 which will be encapsulated may be in a range of 0.2 to 100 times the widths H, I, such as in a range of 9 to 15 times the widths H, I.

The height F of the interconnect 120 which will be encapsulated may be in a range of 1 to 1000 times the widths H, I, such as in a range of 20 to 30 times the widths H, I.

The width J of the spacing between adjacent fingers 126 may be in a range of 0.1 to 10 times the widths H, I, such as in a range of 0.5 to 1.5 times the widths H, I.

The width K of the fingers 126 may be in a range of 0.1 to 10 times the widths H, I, such as in a range of 0.5 to 1.5 times the widths H, I.

The diameter L of the throughgoing hole of the anchoring structure 130 may be in a range of 0.1 to 10 times the widths H, I, such as in a range of 0.3 to 0.7 times the widths H, I.

The diameter M of the throughgoing hole of the lateral anchor 132 may be in a range of 0.1 to 10 times the widths H, I, such as in a range of 0.5 to 1.5 times the widths H, I.

The length A of the flexible printed circuit board may be in a range of 10 mm to 1000 mm. The connecting length E may be in a range of 0.0001-0.999 times the length A.

As further shown in FIG. 3, the fingers 126 extend in parallel. This implies that the connections between the first electronic circuit 102 and the second stretchable electronic circuit device 110 may be provided in a small area.

Figure 4:
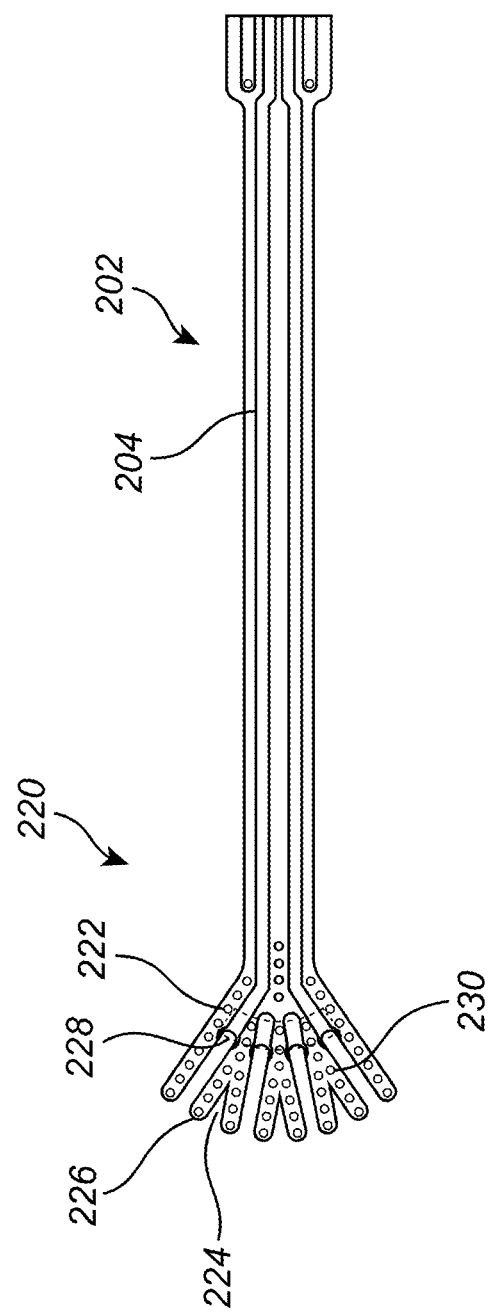
FIG. 4 is a schematic view of an interconnect according to another embodiment.

Referring now to FIG. 4, design of the interconnect 220 according to another embodiment will be discussed. As shown in FIG. 4, the interconnect 220 may comprise connectors 224 that form the expansion end 222 of the first electronic circuit 202 with increased lateral dimension at the end to be connected to the second stretchable electronic circuit device.

Thus, the connectors 224 may comprise fingers 226 that are branched to expand the lateral dimension of the first electronic circuit 202. The fingers 226 are shown to be branched from a flexible printed circuit board forming a common carrier of the conductive lines 204. However, pairs of adjacent fingers 226 may still be arranged to be parallel to each other, as illustrated in FIG. 4.

This implies that the connections between the first electronic circuit 202 and the second stretchable electronic circuit device may be provided in a larger lateral area compared to the embodiment shown in FIG. 3. However, the interconnect 220 may provide a firm connection based on anchoring structures 230 without any lateral anchor that is arranged at a lateral side of the overlap region 228.

Figure 5:
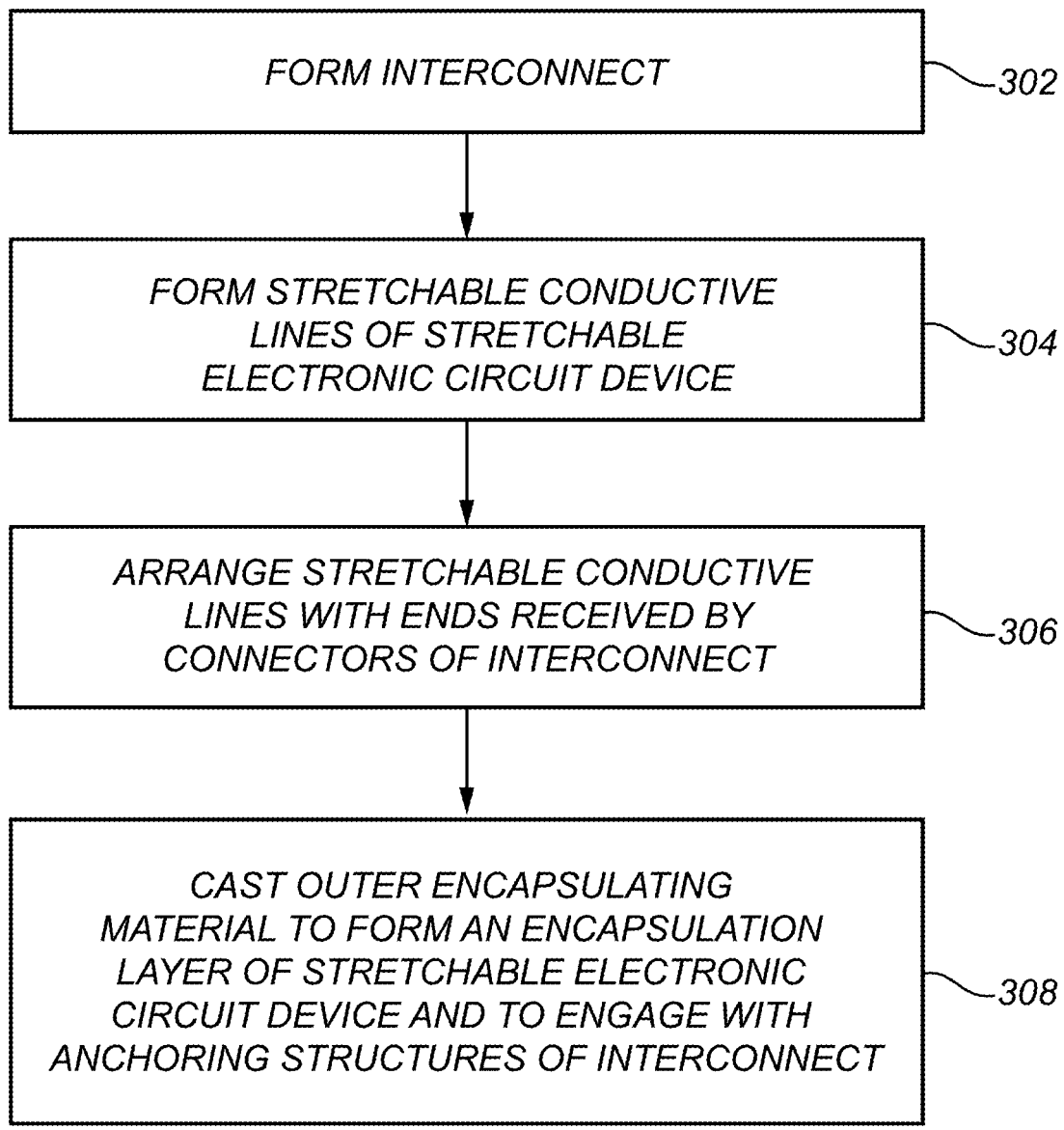
FIG. 5 is a flowchart of a method according to an embodiment.

Referring now to FIG. 5, a method of manufacturing the electronic assembly 100 will be described.

The method comprises forming 302 the interconnect 120. The interconnect 120 may be separately manufactured to form the interconnect 120. The interconnect 120 may be manufactured in association with manufacturing of the first electronic circuit 102, such that the interconnect 120 may be formed to be integral with the first electronic circuit 102, such as being integral with a flexible printed circuit board.

The interconnect 120 comprises conductive lines 104 of the first electronic circuit 102, wherein the conductive lines 104 are arranged in a plane. The interconnect 120 further comprises connectors 124 configured to define a path of ends of the conductive lines 104 in the plane. The interconnect 120 further comprises at least one anchoring structure 130 for providing an anchoring of the first electronic circuit 102 to the stretchable conductive lines 104, wherein at least one anchoring structure 130 provides anchoring transverse to the plane.

The method may further comprise forming 304 stretchable conductive lines 112 of the second stretchable electronic circuit device 110. The stretchable conductive lines 112 may be formed on a base plate, which may form a layer of stretchable material of the second stretchable electronic circuit device 110. A conductive material that is in liquid state may be applied. The mask may thus define paths of the stretchable conductive lines 112 being formed on the layer of stretchable material.

The method may further comprise arranging 306 the stretchable conductive lines 112 such that ends of the stretchable conductive lines 112 are received by the connectors 124 of the interconnect 120. The stretchable conductive lines 112 may be arranged to be received by the connectors 124 of the interconnect 120 by the interconnect 120 being provided in relation to the base plate when the stretchable conductive lines 112 are to be formed. Thus, when the stretchable conductive lines 112 are formed, the stretchable conductive lines 112 may further be arranged in a desired relation to the interconnect 120.

However, it should be realized that the stretchable conductive lines 112 may be separately formed and provided exposed on a stretchable material. Then, the stretchable conductive lines 112 may be arranged in relation to the interconnect 120 such that the stretchable conductive lines 112 are arranged in a desired relation to the interconnect 120.

The connectors 124 define an overlap in the plane between each end of the conductive lines 104 with a corresponding end of the stretchable conductive lines 112, wherein the overlap extends from the end of the stretchable conductive line 112 along the stretchable conductive line 112 and provides an electrical connection between the conductive lines 112 and the stretchable conductive lines 112 over the entire overlap.

The stretchable conductive lines 112 are further arranged such that the anchoring structures 130 provide anchoring positions on opposite sides 129a, 129b of the overlap.

The method further comprises casting 308 an outer encapsulating material to form an encapsulation layer. The stretchable conductive lines 112 and the interconnect 120 may be arranged in a mold exposing a surface of the stretchable conductive lines 112 and the interconnect 120.

The outer encapsulating material may then be cast into the mold. The outer encapsulating material may be the same material as used in the base plate on which the stretchable conductive lines 112 are formed. The casting of the outer encapsulating material may thus involve forming an integral material layer of the base plate and the outer encapsulating material being provided into the mold.

When the outer encapsulating material is cast into the mold, the stretchable conductive lines 112, and any electronic components connected by the stretchable conductive lines 112 may become embedded into the outer encapsulating layer. Thus, a stretchable electronic circuit device 110 is formed, which may be stretched to change interrelationship between the components embedded in the outer encapsulating layer.

Further, when the outer encapsulating material is cast into the mold, the outer encapsulating material engages with the anchoring structures 130 of the interconnect 120. Thus, the anchoring structures 130 are also embedded in the encapsulating material, wherein the encapsulating material is anchored in relation to fixed positions defined by the anchoring structures 130. Thus, the encapsulating material may be immobilized at the anchoring positions for anchoring the encapsulating material. This implies that deformation of the encapsulating material between the anchoring positions will be very limited, such that the stretchable conductive lines 112 become firmly connected to the conductive lines 104 of the first electronic circuit 102.

The outer encapsulating material may be formed by an elastomer or thermoplastic material. For instance, silicone rubbers, polyurethanes, or natural rubbers may be used. However, as understood by the person skilled in the art, other alternatives are also possible.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. An interconnect for connecting a first electronic circuit to a second, external stretchable electronic circuit device, the interconnect comprising:
    conductive lines of the first electronic circuit, wherein the conductive lines are arranged in a plane;
    connectors configured to define a path of ends of the conductive lines in the plane and configured to receive ends of stretchable conductive lines of the second, external stretchable electronic circuit device, wherein the connectors are configured to define an overlap in the plane between each end of the conductive lines with a corresponding end of the stretchable conductive lines, wherein the overlap extends from the end of the stretchable conductive line along the stretchable conductive line and provides an electrical connection between the conductive lines and the stretchable conductive lines over the entire overlap; and
    at least one anchoring structure for providing an anchoring of the first electronic circuit with the second, external stretchable electronic circuit device, wherein the at least one anchoring structure provides anchoring transverse to the plane in anchoring positions on opposite sides of the overlap.

2. The interconnect according to claim 1, wherein the connectors comprise a plurality of fingers spaced apart such that the end of one stretchable conductive line of the stretchable conductive lines is configured to be received between two adjacent fingers.

3. The interconnect according to claim 2, wherein the connectors define a path of the conductive lines of the first electronic circuit between the fingers extending along a part of the fingers.

4. The interconnect according to claim 2, wherein the fingers extend in parallel.

5. The interconnect according to claim 2, wherein the fingers are branched in different directions from a common carrier for carrying the conductive lines.

6. The interconnect according to claim 1, wherein the anchoring structures comprise throughgoing holes in the connectors.

7. The interconnect according to claim 1, wherein the anchoring structures comprise one or more of: hooks, barbs, fibrous network, a surface exposed to surface activating treatment or a chemically treated surface.

8. The interconnect according to claim 1, further comprising a lateral anchor extending laterally from the overlap and including at least one anchoring structure providing anchoring transverse to the plane in anchoring positions at a lateral side of the overlap.

9. The interconnect according to claim 1, wherein the conductive lines are arranged at a flexible printed circuit board.

10. The interconnect according to claim 1, wherein the flexible printed circuit board comprises a connector for connecting the flexible printed circuit board to a rigid printed circuit board such that the interconnect is configured to form an intermediate connector between the second, external stretchable electronic circuit device and the rigid printed circuit board.

11. An electronic assembly, comprising:
    a stretchable electronic circuit device comprising stretchable conductive lines; and
    an interconnect according to claim 1 connected to the stretchable electronic circuit device.

12. The electronic assembly according to claim 11, further comprising an outer encapsulating layer surrounding the stretchable electronic circuit device, wherein the encapsulating layer is configured to surround the connectors and engage with the at least one anchoring structure of the interconnect forming a connection between the anchoring structure and the stretchable electronic circuit device.

13. The electronic assembly according to claim 12, wherein the encapsulating layer is configured to embed the anchoring structures in the encapsulating layer such that the anchoring positions define locations in the stretchable electronic circuit device being immobilized in relation to each other.

14. The electronic assembly according to claim 11, wherein the stretchable conductive lines are formed by a conductive material that is in a liquid state in an operating temperature range.

15. A method for manufacturing an electronic assembly, said method comprising:
    forming stretchable conductive lines;
    forming an interconnect comprising: conductive lines of a first electronic circuit, wherein the conductive lines are arranged in a plane; connectors configured to define a path of ends of the conductive lines in the plane; and at least one anchoring structure for providing an anchoring of the first electronic circuit with the stretchable conductive lines, wherein the at least one anchoring structure provides anchoring transverse to the plane;
    arranging the stretchable conductive lines such that ends of the stretchable conductive lines are received by the connectors of the interconnect, wherein the connectors define an overlap in the plane between each end of the conductive lines with a corresponding end of the stretchable conductive lines, wherein the overlap extends from the end of the stretchable conductive line along the stretchable conductive line and provides an electrical connection between the conductive lines and the stretchable conductive lines over the entire overlap, wherein the stretchable conductive lines are further arranged such that the at least one anchoring structure provides anchoring positions on opposite sides of the overlap;

casting an outer encapsulating material to form an encapsulation around the stretchable conductive lines and to engage with the at least one anchoring structure for anchoring the interconnect to the stretchable conductive lines.

* * * * *